(12) United States Patent
Barrow

(10) Patent No.: US 6,693,458 B1
(45) Date of Patent: Feb. 17, 2004

(54) APPARATUS FOR AN OPTIMIZED HIGH SPEED COMPARATOR

(75) Inventor: Steven Michael Barrow, Gilbert, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/251,119

(22) Filed: Sep. 19, 2002

(51) Int. Cl.[7] .................. H03K 19/0175; H03K 19/20; H03K 5/22
(52) U.S. Cl. .................. 326/82; 326/104; 327/89
(58) Field of Search .................. 326/82–83, 86, 326/104; 327/74, 76–79, 89

(56) References Cited

U.S. PATENT DOCUMENTS

| | | | | |
|---|---|---|---|---|
| 3,955,102 A | * | 5/1976 | Chi | 327/76 |
| 5,336,947 A | * | 8/1994 | Lehning | 327/18 |
| 5,488,322 A | * | 1/1996 | Kaplinsky | 327/74 |
| 6,181,169 B1 | | 1/2001 | Hu | 327/77 |
| 6,320,426 B1 | | 11/2001 | Shih | 327/65 |

FOREIGN PATENT DOCUMENTS

JP    05022091 A  *  1/1993  .......... H03K/3/153

* cited by examiner

Primary Examiner—James H Cho
(74) Attorney, Agent, or Firm—Darby & Darby

(57) ABSTRACT

A circuit for optimizing the operation of a comparator capable of rail-to-rail operation and relatively high speed. The optimized comparator can output relatively narrow pulses in response to an input signal swinging between the rails of the power supply. Further, the comparator can provide an indication of an under voltage condition of an input signal with respect to a reference voltage. Also, the comparator can conserve power consumption by disabling those portions of the comparator that are not currently employed to resolve a high or low swing of the input signal.

22 Claims, 3 Drawing Sheets

APPARATUS FOR AN OPTIMIZED HIGH SPEED COMPARATOR

FIELD OF THE INVENTION

The present invention is directed to a comparator, and more particularly, to a high speed and power conserving comparator that is operable up to the rails of a power supply.

BACKGROUND OF THE INVENTION

Typically, applications, such as switching power supplies and regulators, employ a pulse width modulator (PWM) circuit to control the ON time of a switch by comparing an error signal to a voltage ramp. In order to hold the integrity of the pulse the comparator must respond very rapidly. These pulses are used by other circuits to supply power to different types of electronic devices, e.g., mobile telephones, pagers, and personal computers.

A PWM circuit usually employs at least one comparator to create the pulses. Also, in many applications it is desirable for the comparator to operate "rail to rail", i.e., the range of operation includes the upper and lower voltages provided by a power supply. However, in the past, high speed, rail to rail comparators have consumed relatively large amounts of power which can be undesirable in many mobile applications.

SUMMARY OF THE INVENTION

The present invention is directed to an apparatus for comparing an input signal to a reference voltage and generating relatively narrow high speed pulses as an output signal. A high comparator is employed for resolving comparisons up to a high rail of a power supply. The high comparator is used to compare the reference voltage to the input signal. A low comparator is employed for resolving comparisons down to a low rail of the power supply. The low comparator is used to compare the reference voltage to the input signal. In response to the common mode level of the input signal, a selector selects either the high comparator or the low comparator to compare the input signal to the reference voltage. The selector disables the unselected comparator; and the selected comparator generates a comparison signal.

Another embodiment of the invention is directed to at least one component that receives the comparison signal from the selected one of the high comparator and the low comparator to provide an output signal. Also, this component includes at least one logical element, including AND, OR, NAND, NOR, inverter, latch, flip-flop, and the like.

Yet another embodiment of the invention is directed to employing the selection of the high comparator to enable the input signal to be resolved substantially near the high rail of the power supply as a pulse. The pulse is operative as the comparison signal. Also, the selection of the low comparator can cause the input signal to be resolved substantially near the low rail of the power supply as a pulse that is operative as the comparison signal. Additionally, if the common mode voltage of the input signals are low, the selector selects the low comparator and disables the high comparator. Furthermore, if the common mode voltage of the input signals are high, the selector selects the high comparator and disables the low comparator.

Still another embodiment of the invention is directed to enabling the low comparator to include at least one P-channel MOSFET and the high comparator includes at least one N-channel MOSFET. Also, the selector can include at least one Schmitt trigger buffer and/or at least one comparator. Additionally, a hysteresis of the selector can be programmed.

Another embodiment of the invention is directed to reducing power consumption in an unselected one of the low comparator and the high comparator that is disabled and further configured in a standby mode. Also, the reference voltage can be a common mode voltage.

DETAILED DESCRIPTION OF THE PREFERRED EMBODIMENT

Figure 1:
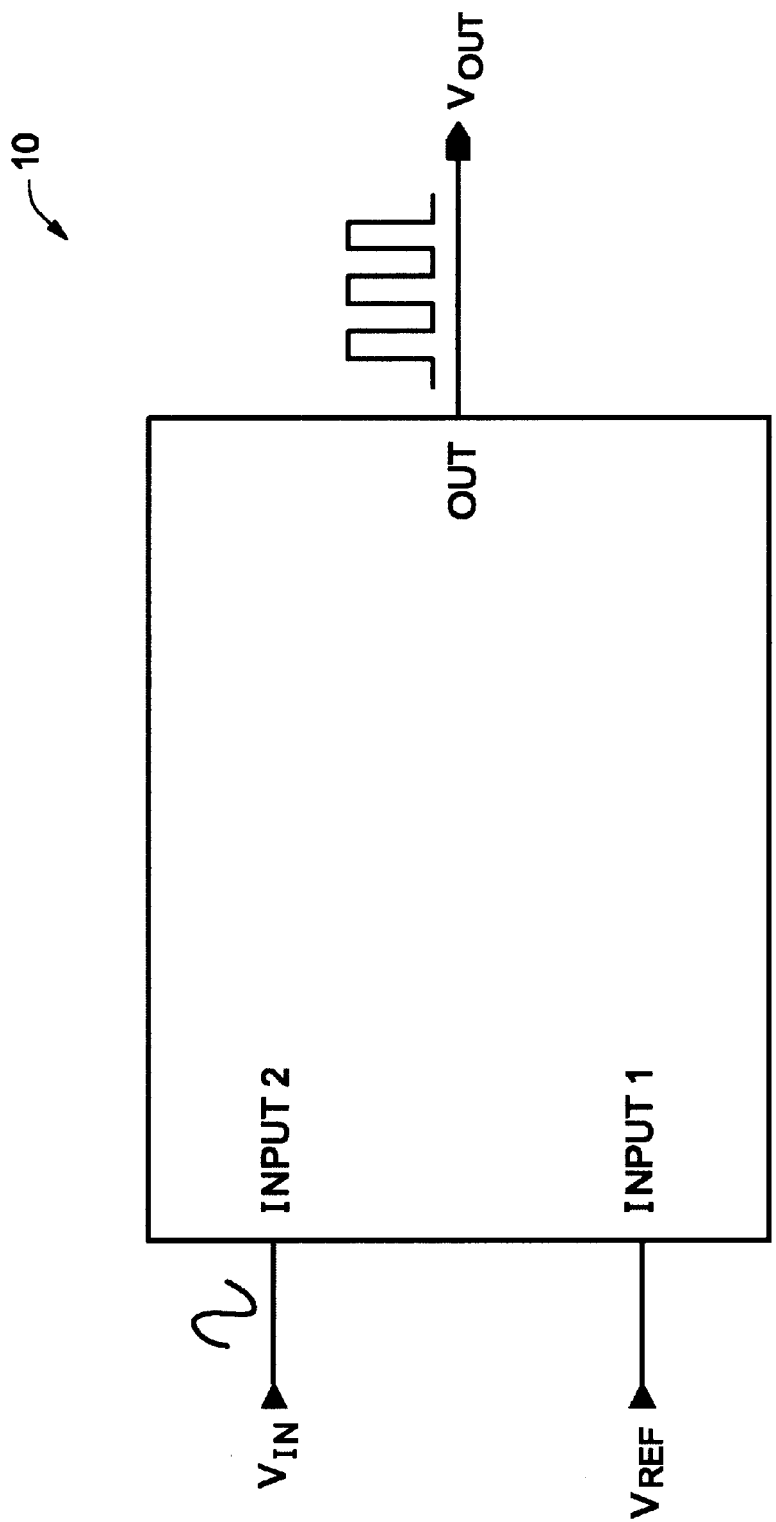
FIG. 1 illustrates a block diagram of a comparator circuit where a relatively small input signal causes the output of relatively large and high speed pulses.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention can be employed with any electronic circuit where it is desirous to provide a comparator that can operate rail-to-rail with reduced power consumption. The invention selects one of two comparators capable of operating at the opposing rail of a power supply to compare an input signal to a reference voltage (Vref), e.g., the common mode voltage. The invention also enables relatively fast operation for a comparator capable of rail-to-rail operation. Typical applications might include pulse width modulators for power supplies, regulators, and the like.

FIG. 1 illustrates a block diagram of comparison circuit 10 where a relatively low input signal Vin is applied at Input 2 and compared to a reference voltage Vref, which is presented at Input 1. In response to Vin, comparison circuit 10 outputs a string of relatively large and narrow pulses as output voltage Vout. These pulses are typically inputted to another circuit that provides pulse width modulation for a power supply or regulator.

Figure 2:
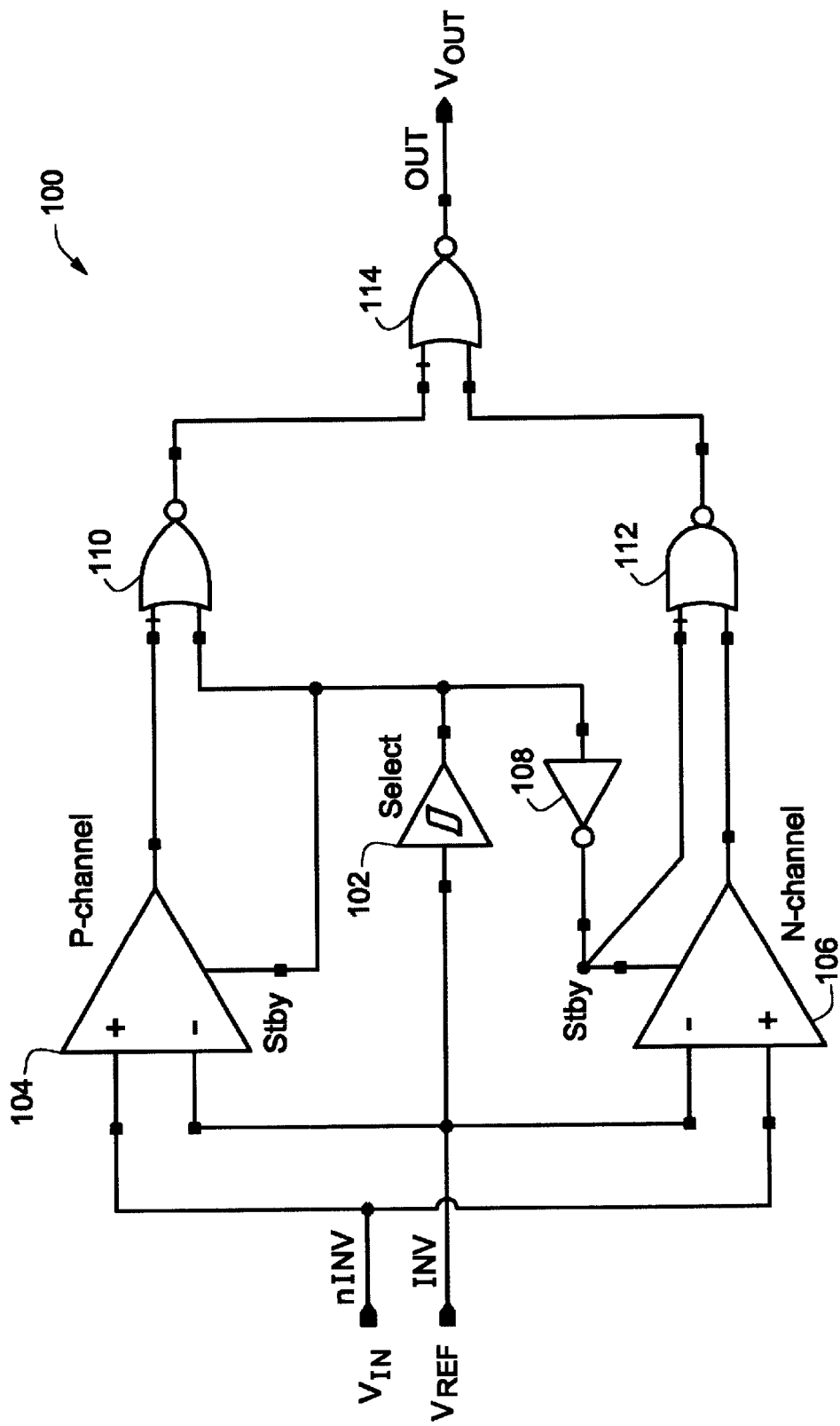
FIG. 2 shows a schematic diagram of a comparator circuit that employs a Schmitt trigger device to select a portion of the circuit for comparing an input signal to a reference voltage.

FIG. 2 illustrates a comparison circuit 100 for optimally selecting a comparator that can operate at one of the rails of the power supply for comparing an input voltage Vin to a reference voltage Vref. In the figure, Vref is applied at an inverting input (NV) and Vin is applied at a non-inverting input (nINV). Although not shown the arrangement may be reversed where Vref is presented at the non-inverting input (nINV) and Vin is applied to the inverting input (INV).

The inverting input (INV) where the reference voltage is applied Vref is also coupled to an inverting input of P-channel comparator 104, an inverting input of N-channel comparator 106 and an input to Schmitt trigger buffer 102. Also, the non-inverting inputs of P-Channel comparator 104 and N-Channel comparator 106 are coupled to the non-inverting input (nINV) where the input signal Vin is applied. An output of P-channel comparator 104 is coupled to an input of NOR gate 110 and an output of N-channel comparator 106 is coupled to an input of NOR gate 112. The output of NOR gate 110 and the output of NOR gate 112 are coupled to the inputs of NOR gate 114. Furthermore, the output of NOR gate 114 is coupled to an output where the output signal (Vout) is presented.

Additionally, the output of Schmitt trigger buffer 102 is coupled to an input to NOR gate 110 and a standby line for P-Channel comparator 104. Also, the output of Schmitt trigger buffer 102 is coupled to an input of inverter 108 where the inverter's output is coupled to both a standby line for N-Channel comparator 106 and an input to NOR gate 112.

When a high input signal (Vin) is presented at the non-inverting input terminal (nINV), this signal is also impressed at the inputs to P-channel comparator 104 and N-channel comparator 106. At substantially the same time, an inversion of the reference voltage (Vref at the INV terminal) is presented at an input to P-channel 104, an input to N-channel 106 and an input to Schmitt trigger buffer 102. After a predetermined delay caused by hysteresis in Schmitt trigger buffer 102, a low Vref signal, with respect to the Schmitt trigger buffer threshold, will cause the buffer to output a low signal which causes P-channel comparator 104 to turn on and N-channel comparator 106 to be disabled (go into standby mode).

Additionally, when the level of the high input signal Vin presented at the input to P-channel comparator 104 reaches a predetermined level, e.g., Vref, the comparator will output a high signal to the input of NOR gate 110, which then outputs an inverted (low) signal to an input of NOR gate 114. Also, the low output signal from Schmitt trigger buffer 102 causes inverter 108 to output a high signal to the other input of NOR gate 112, which in turn causes the gate to output a low signal to the other input of NOR gate 114. Moreover, once two low signals are presented at the inputs to NOR gate 114, a high signal (Vout) is outputted by the gate at the output terminal.

Alternatively, if the Vref signal presented at the inverting terminal (INV) is high with respect to the Schmitt trigger buffer threshold, substantially the same operation occurs as discussed above except that P-channel comparator 104 is placed in standby mode and N-Channel comparator 106 is enabled to output a high signal to an input of NOR gate 112 when the level of the low input signal reaches a predetermined value such as Vref. Also, a low signal is outputted by inverter 108 to the other input of NOR gate 112, which in turn outputs a low signal to an input of NOR gate 114.

Another low signal is outputted by NOR gate 110 and applied to the other input of NOR gate 114. The other low signal outputted by NOR gate 110 is caused by the high signal outputted by Schmitt trigger buffer 102 to an input of NOR gate 110 and the standby mode of P-channel comparator 104, which in turn causes a low signal to be outputted to the other input of NOR gate 110. Furthermore, the low signals presented at the inputs to NOR gate 114 causes the gate to output a high output signal (Vout) at the output terminal.

The hysteresis of Schmitt trigger buffer 102 enables the input signal to settle down before the buffer selects the comparator appropriate for handling the high or low swing of the inputted signal at that time (P-channel or N-channel comparators) as well as acting as a debounce switch to prevent undetermined comparator selection common with single threshold comparators.

The disablement of one comparator when employing its complement comparator, e.g., N-channel versus P-channel, enables the invention to quickly resolve a comparison of an input signal to a reference voltage at either one the lower or upper rails of its power supply. Also, by employing a standby mode for a comparator that is not currently used for comparing, the invention reduces power consumption. Further, since the P-channel and N-channel comparators are configured to complementarily resolve comparisons at predetermined levels up to their respective rails of a power supply, the overall operation of the invention is such that high speed and relatively narrow pulses can be generated for the output signal Vout when the input signal Vin passes the Schmitt trigger buffer threshold twice. Alternatively, when the input signal passes the Schmitt trigger buffer threshold once, the output signal Vout can be used to provide an indication that the two input signals, i.e., Vin and Vref, have passed each other. This type of output signal typically occurs when the invention is used in an under voltage comparator application. Also, it is understood that in other applications and embodiments the predetermined levels for resolving comparisons by the P-channel and N-channel comparators may be set substantially less than the upper or lower rails of the power supply, respectively. Further, it is understood that in other applications the invention may be employed in over voltage comparator applications in substantially the same manner as the under voltage comparator applications discussed herein.

Figure 3:
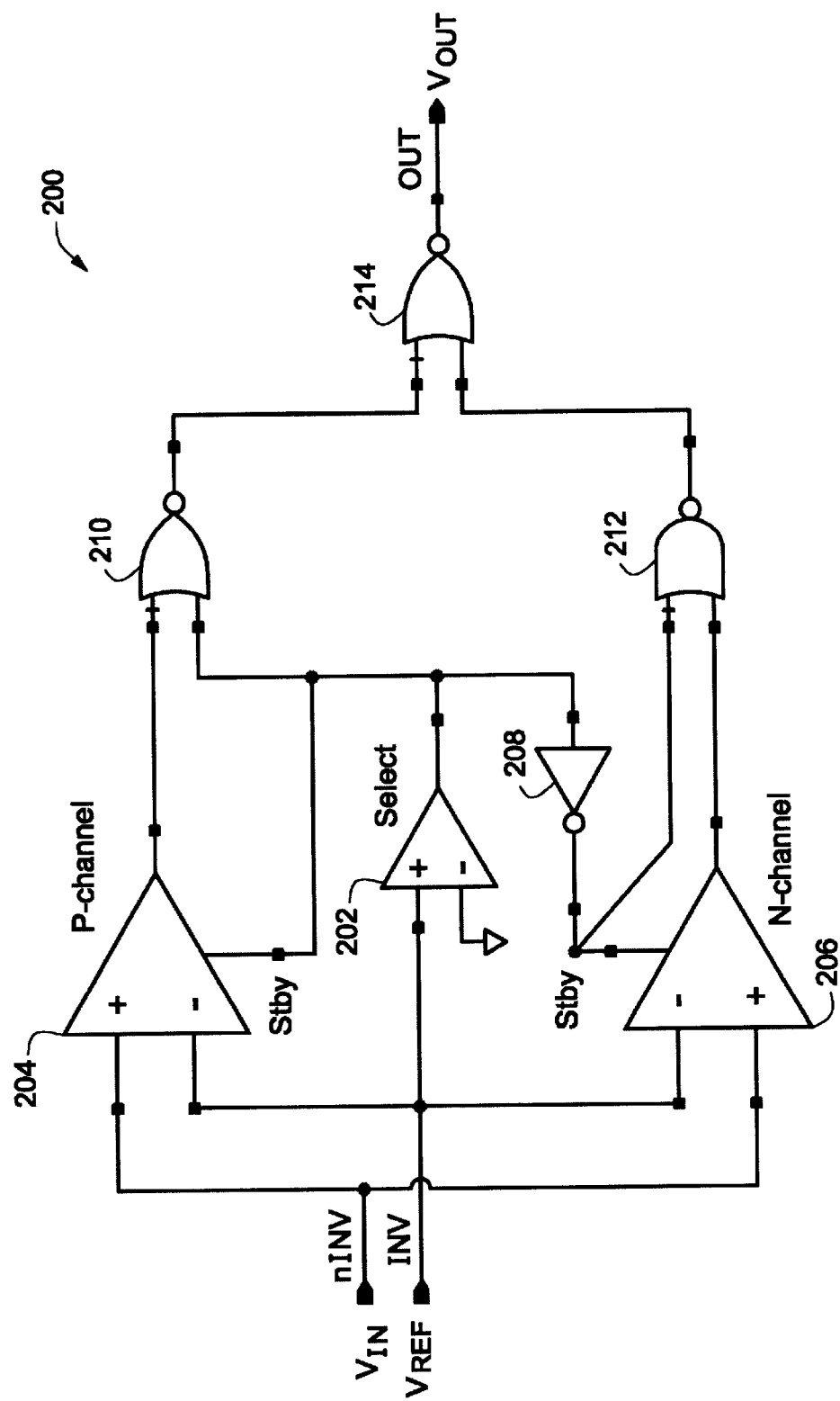
FIG. 3 shows another circuit that employs a comparator device to select a portion of the circuit for comparing an input signal to a reference voltage, in accordance with the present invention.

FIG. 3 illustrates substantially the same arrangement of devices as shown in FIG. 2 except for comparator 202 is configured for selecting one of the two complementary comparators (P-channel comparator 204 or N-channel comparator 206), instead of a Schmitt trigger buffer. The arrangement of comparator 202 is substantially similar to the configuration of Schmitt trigger buffer 102, as shown in FIG. 2. However, the inverting input of comparator 202 is coupled to common. Further, the non-inverting input of comparator 202 is coupled to the inverting terminal (INV, the inverting input of P-channel comparator 204, and the inverting input of N-channel comparator 206. The output of comparator 202 is arranged in substantially the same manner as the output of Schmitt trigger buffer 102 in FIG. 2.

Comparator 202 may operate as either a voltage comparator or a current comparator. Also, the hysteresis of comparator 202 is selected to enable the input signal Vin to settle down before enabling or disabling the P-channel comparator 204 and N-channel comparator 206 as well as act as a debounce switch to prevent undetermined comparator selection common with single threshold comparators. As shown in FIG. 3, this embodiment conserves power while enabling rail-to-rail high speed comparisons of an input signal Vin with a reference voltage Vref for quickly generating an output signal Vout as a pulse or an indication of an under voltage condition.

Although the invention is shown employing NOR logic gates in FIGS. 2 and 3, it is understood that other configurations of other logic devices can be configured to provide substantially the same result in substantially the same manner, e.g., AND, OR, NAND, inverters, latches, flipflops, and the like. Also, although not shown, it is understood that the hysteresis of the "select" device, i.e., Schmitt trigger buffer 102 and comparator 202, may be programmable for different applications. Furthermore, it is understood that logic gates can be selected to enable high speed and relatively narrow pulses or indications of under voltage conditions in the output signal Vout at the output terminal to be substantially larger than the input signal Vin.

The above specification, examples and data provide a complete description of the manufacture and use of the invention. Since many embodiments of the invention can be made without departing from the spirit and scope of the invention, the invention resides in the claims hereinafter appended.

We claim:

1. An apparatus for comparing an input signal to a reference voltage, comprising:
   (a) a high comparator that is operable to resolve up to a positive rail of a power supply, wherein the high comparator is employable to compare the reference voltage to the input signal;
   (b) a low comparator that is operable to resolve up to a negative rail of the power supply, wherein the low comparator is employable to compare the reference voltage to the input signal; and
   (c) in response to the input signal, a selector that is operable to select one of the high comparator and the low comparator to compare the input signal to the reference voltage, wherein an unselected one of the high comparator and the low comparator is disabled by the selector, and wherein in response to comparing the input signal to the reference voltage, a comparison signal is generated by the selected one of the high comparator and the low comparator.

2. The apparatus of claim 1, further comprising at least one component that employs the comparison signal to provide an output signal.

3. The apparatus of claim 2, wherein the at least one component includes at least one logical element, including AND, OR, NAND, NOR, inverter, latch, and flip-flop.

4. The apparatus of claim 1, wherein the selection of the high comparator causes the input signal to be resolved at a threshold that is configurable as high as the positive rail of the power supply as a step, wherein the step is operative as the comparison signal.

5. The apparatus of claim 1, wherein the selection of the low comparator causes the input signal to be resolved at a threshold that is configurable as low as the negative rail of the power supply as a step, wherein the step is operative as the comparison signal.

6. The apparatus of claim 1, wherein if the input signal is low, the selector selects the low comparator and disables the high comparator.

7. The apparatus of claim 1, wherein if the input signal is high, the selector selects the high comparator and disables the low comparator.

8. The apparatus of claim 1, wherein the high comparator includes at least one N-channel MOSFET.

9. The apparatus of claim 1, wherein the low comparator includes at least one P-channel MOSFET.

10. The apparatus of claim 1, wherein the selector includes at least one Schmitt trigger buffer.

11. The apparatus of claim 1, wherein the selector includes at least one comparator.

12. The apparatus of claim 1, wherein a hysteresis of the selector is programmable.

13. The apparatus of claim 1, wherein the unselected one of the low comparator and the high comparator that is disabled is further configured in a standby mode that causes a reduction in power consumption.

14. The apparatus of claim 1, wherein the reference voltage is a common mode voltage.

15. The apparatus of claim 1, wherein the comparison signal indicates an under voltage condition relative to the reference voltage when the input signal crosses a threshold of the selected one of the high comparator and the low comparator.

16. The apparatus of claim 1, wherein the comparison signal further comprises a pulse when the input signal twice crosses a threshold of the selected one of the high comparator and the low comparator.

17. An apparatus for comparing an input signal to a reference voltage, comprising:
   (a) a high comparator that is operable between common and the positive rail of a power supply, wherein the high comparator compares the reference voltage to the input signal;
   (b) a low comparator that is operable between common and the negative rail of the power supply, wherein the low comparator is employed to compare the reference voltage to the input signal; and
   (c) a selector that is operable to select one of the high comparator and the low comparator to compare the input signal to the reference voltage, wherein an unselected one of the high comparator and the low comparator is disabled by the selector and an output signal is generated by the selected one of the high comparator and the low comparator in response to the input signal.

18. The apparatus of claim 17, wherein if the input signal is low, the selector selects the low comparator and disables the high comparator, and wherein if the input signal is high, the selector selects the high comparator and disables the low comparator.

19. The apparatus of claim 17, wherein the comparison signal farther comprises an indication of an under voltage condition relative to the reference voltage when the input signal crosses a threshold of the selected one of the high comparator and the low comparator.

20. The apparatus of claim 17, wherein the comparison signal further comprises an indication of an over voltage condition relative to the reference voltage when the input signal crosses a threshold of the selected one of the high comparator and the low comparator.

21. The apparatus of claim 17, wherein the comparison signal further comprises a pulse when the input signal twice crosses the threshold of the selected one of the high comparator and the low comparator.

22. An apparatus for comparing an input signal to a reference voltage, comprising:
   (a) means for enabling a high comparator that is operable to resolve up to a positive rail of a power supply, wherein the high comparator is employable to compare the reference voltage to the input signal;
   (b) means for enabling a low comparator that is operable to resolve up to a negative rail of the power supply, wherein the low comparator is employable to compare the reference voltage to the input signal; and
   (c) in response to the input signal, means for a selector that is operable to select one of the high comparator and the low comparator to compare the input signal to the reference voltage, wherein an unselected one of the high comparator and the low comparator is disabled by the selector, and wherein in response to comparing the input signal to the reference voltage, a comparison signal is generated by the selected one of the high comparator and the low comparator.

* * * * *

UNITED STATES PATENT AND TRADEMARK OFFICE
CERTIFICATE OF CORRECTION

PATENT NO. : 6,693,458 B1
DATED : February 17, 2004
INVENTOR(S) : Steven M. Barrow It is certified that error appears in the above-identified patent and that said Letters Patent is hereby corrected as shown below:

<u>Title page,</u>
Item [56], References Cited, FOREIGN PATENT DOCUMENTS, delete "H03K/3/153" and insert -- H03K05/153 --.

<u>Column 3,</u>
Line 5, delete "(NV)" and insert -- (INV) --.

Signed and Sealed this

Twelfth Day of April, 2005

JON W. DUDAS
*Director of the United States Patent and Trademark Office*